(12) United States Patent
Bhintade et al.

(10) Patent No.: US 12,274,107 B2
(45) Date of Patent: Apr. 8, 2025

(54) MODIFICATION OF STRESS RESPONSE AND ADHESION BEHAVIOR OF DIELECTRIC THROUGH TUNING OF MECHANICAL PROPERTIES

(71) Applicant: FlexEnable Technology Ltd., Cambridgeshire (GB)

(72) Inventors: Rashmi Sachin Bhintade, Hampshire (GB); Tomas Backlund, Bischofsheim (DE)

(73) Assignee: FLEXENABLE TECHNOLOGY LIMITED, Cambridge (GB)

( * ) Notice: Subject to any disclaimer, the term of this patent is extended or adjusted under 35 U.S.C. 154(b) by 482 days.

(21) Appl. No.: 17/622,470

(22) PCT Filed: Jun. 24, 2020

(86) PCT No.: PCT/EP2020/067707
§ 371 (c)(1),
(2) Date: Dec. 23, 2021

(87) PCT Pub. No.: WO2020/260393
PCT Pub. Date: Dec. 30, 2020

(65) Prior Publication Data
US 2022/0263036 A1    Aug. 18, 2022

(30) Foreign Application Priority Data

Jun. 24, 2019 (EP) .................................... 19181896

(51) Int. Cl.
*H10K 10/46* (2023.01)
*H10K 85/10* (2023.01)

(52) U.S. Cl.
CPC ......... *H10K 10/474* (2023.02); *H10K 85/111* (2023.02); *H10K 85/151* (2023.02)

(58) Field of Classification Search
CPC ... H10K 10/474; H10K 85/111; H10K 85/151
See application file for complete search history.

(56) References Cited

U.S. PATENT DOCUMENTS 8,557,927 B2 * 10/2013 Hsueh ................ C08F 293/005
                                                                548/542
8,896,071 B2 * 11/2014 Von Werne .......... H01L 21/022
                                                                257/411

(Continued)

FOREIGN PATENT DOCUMENTS

CN          1698217 A       11/2005
CN        105324408 A        2/2016

(Continued)

OTHER PUBLICATIONS

Polyisobutylene paper, "Polyisobutylene at a glance," 2014 (Year: 2014).*

(Continued)

*Primary Examiner* — Joseph C. Nicely
(74) *Attorney, Agent, or Firm* — Tarolli, Sundheim, Covell & Tummino LLP

(57) ABSTRACT

The disclosed subject matter relates to a dielectric stack that includes a dielectric layer formed from a dielectric material that includes one or more constituent components each having a Tg value of 70° C. or lower and that is annealed at a temperature exceeding the highest Tg value of the one or more constituent components.

14 Claims, 2 Drawing Sheets

(56) References Cited

U.S. PATENT DOCUMENTS

| | | | |
|---|---|---|---|
| 8,896,072 B2 | 11/2014 | Tan et al. | |
| 2005/0104058 A1 | 5/2005 | Veres et al. | |
| 2006/0214154 A1 | 9/2006 | Yang et al. | |
| 2010/0155708 A1* | 6/2010 | Von Werne | H01L 21/022 |
| | | | 257/288 |
| 2014/0160623 A1 | 6/2014 | Baer et al. | |
| 2015/0236282 A1* | 8/2015 | Afzali-Ardakani | |
| | | | H01L 29/66742 |
| | | | 257/40 |
| 2017/0279048 A1* | 9/2017 | Rhodes | C08F 132/08 |
| 2019/0148657 A1 | 5/2019 | Afonina et al. | |
| 2020/0238227 A1* | 7/2020 | Dorin | C08J 9/283 |
| 2021/0370237 A1* | 12/2021 | Dorin | C02F 1/44 |

FOREIGN PATENT DOCUMENTS

| | | |
|---|---|---|
| CN | 109196676 A | 1/2019 |
| EP | 2207217 A1 | 7/2010 |
| WO | 2017198587 A1 | 11/2017 |
| WO | 2019023135 A1 | 1/2019 |

OTHER PUBLICATIONS

International Search Report for PCT/EP2020/067707 dated Sep. 16, 2020.

Chinese Office Action dated May 29, 2024 for Chinese Application No. 202080046792.X.

Taiwanese Office Action dated Jun. 26, 2024 for Taiwanese Application No. 109121608.

* cited by examiner

MODIFICATION OF STRESS RESPONSE AND ADHESION BEHAVIOR OF DIELECTRIC THROUGH TUNING OF MECHANICAL PROPERTIES

BACKGROUND

Field

The disclosed subject matter relates to electronic devices, specifically to dielectric stacks and a process of manufacturing the same that eliminates stress in the dielectric stack and is therefore resistant to delamination failures. The dielectric stacks are manufactured from and include a vapor deposited dielectric that overlays an organic dielectric which in turn overlays a polymeric organic semiconductor layer disposed on a substrate.

Related Art

There has been growing interest in organic electronic (OE) devices, such as organic field effect transistors (OFET) for use in the backing panels/planes of display devices or logic capable circuits and organic photovoltaic (OPV) devices. A conventional OFET has a gate electrode, a gate insulator layer made of a dielectric material (also referred to as "dielectric" or "gate dielectric"), source and drain electrodes, a semiconducting layer made of an organic semiconductor (OSC) material, and typically also includes a passivation layer on top of the aforementioned layers to provide protection against environmental influence or against damage from subsequent device manufacturing steps.

In some devices that employ an OSC a dielectric stack is included that overlays the OSC. As shown in FIG. 1, a dielectric stack 10 includes a vapor deposited dielectric 20 overlaying an organic dielectric layer 30 which in turn overlays an OSC layer 40. The dielectric stack 10 is disposed on a substrate 50. A typically utilized vapor deposited dielectric 20 in dielectric stacks would be a poly(p-xylylene) polymer (such as those sold under the trade name Parylene™). Such dielectric stacks often experience excessive stress at the interface between the vapor deposited dielectric 20 and the organic dielectric 30 overlaying the OSC layer 40 resulting from the vapor-phase deposition of the former on the latter. Not surprisingly, this stress may lead to device defect (e.g., delamination) and subsequent failure.

Thus, there is a need to develop a dielectric stack, as well as a method for manufacturing the same, where the dielectric stack does not exhibit excessive stress during manufacturing, or otherwise retain any excessive stress after being manufactured, at the interface between the vapor deposited dielectric and the organic dielectric overlaying the OSC.

SUMMARY

In one aspect, the disclosed subject matter relates to a dielectric stack having reduced stress that includes a vapor deposited dielectric that overlays an organic dielectric which in turn overlays a polymeric OSC material that is collectively to be disposed on a substrate.

In another aspect the disclosed subject matter relates to a dielectric stack that includes a dielectric layer formed from a dielectric material that includes one or more constituent components each having a Tg value of 70° C. or lower. In a further aspect, the dielectric stack includes a dielectric layer formed from a dielectric material that consists essentially of one or more constituent components each having a Tg value of 70° C. or lower. In yet a further aspect, the dielectric stack includes a dielectric layer formed from a dielectric material that consists of one or more constituent components each having a Tg value of 70° C. or lower. In yet a further aspect, the dielectric layer has a thickness of 200 nm or greater.

In another aspect the disclosed subject matter relates to a method for manufacturing and using a dielectric stack having reduced stress that includes a dielectric layer formed from a dielectric material that includes one or more constituent components each having a Tg value of 70° C. or lower. In a further aspect, the method includes forming the dielectric layer by annealing the dielectric material at a temperature exceeding the highest Tg value of the one or more constituent components. In yet a further aspect, the method includes forming the dielectric layer at a thickness of 200 nm or greater.

BRIEF DESCRIPTION OF THE DRAWINGS

The accompanying drawings, which are included to provide a further understanding of the disclosed subject matter and are incorporated in and constitute a part of this specification, illustrate embodiments of the disclosed subject matter and together with the description serve to explain the principles of the disclosed subject matter. In the drawings.

DEFINITIONS

Figure 1:
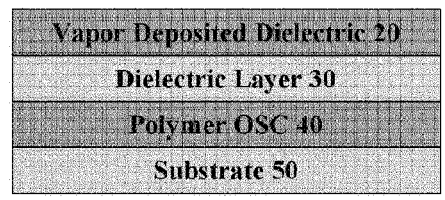
FIG. 1 illustrates a dielectric stack 10 disposed on a substrate 50 where the dielectric stack 10 includes a vapor deposited dielectric 20 disposed on an organic dielectric layer 30 which in turn overlays a polymeric OSC layer 40.

Unless otherwise stated, the following terms used in the specification and claims shall have the following meanings for this application.

In this application, the use of the singular includes the plural, and the words "a," "an" and "the" mean "at least one" unless specifically stated otherwise. Furthermore, the use of the term "including," as well as other forms such as "includes" and "included," is not limiting. Also, terms such as "element" or "component" encompass both elements or components including one unit and elements or components that include more than one unit, unless specifically stated otherwise. As used herein, the conjunction "and" is intended to be inclusive and the conjunction "or" is not intended to be exclusive, unless otherwise indicated. For example, the phrase "or, alternatively" is intended to be exclusive. As used herein, the term "and/or" refers to any combination of the foregoing elements including using a single element.

The terms "about" and "approximately," when used in connection with a measurable numerical variable, refers to the indicated value of the variable and to all values of the variable that are within the experimental error of the indicated value (e.g., within the 95% confidence limit for the mean) or within percentage of the indicated value (e.g., ±10%, ±5%), whichever is greater.

As used herein, "$C_{x-y}$" designates the number of carbon atoms in a chain. For example, 01-6 alkyl refers to an alkyl chain having a chain of between 1 and 6 carbons (e.g., methyl, ethyl, propyl, butyl, pentyl and hexyl). Unless specifically stated otherwise, the chain can be linear or branched.

Unless otherwise indicated, "alkyl" refers to hydrocarbon groups which can be linear, branched (e.g., methyl, ethyl, propyl, isopropyl, tert-butyl and the like), cyclic (e.g., cyclohexyl, cyclopropyl, cyclopentyl and the like) or multicyclic (e.g., norbornyl, adamantly and the like). These alkyl moieties may be substituted or unsubstituted.

"Halogenated alkyl" refers to a linear, cyclic or branched saturated alkyl group as defined above in which one or more of the hydrogens has been replaced by a halogen (e.g., F, Cl, Br and I). Thus, for example, a fluorinated alkyl (a.k.a. "fluoroalkyl") refers to a linear, cyclic or branched saturated alkyl group as defined above in which one or more of the hydrogens has been replaced by fluorine (e.g., trifluoromethyl, pefluoroethyl, 2,2,2-trifluoroethyl, prefluoroisopropyl, perfluorocyclohexyl and the like). Such haloalkyl moieties (e.g., fluoroalkyl moieties), if not perhalogenated/multihalogentated, may be unsubstituted or further substituted.

"Alkoxy" (a.k.a. "alkyloxy") refers to an alkyl group as defined above which is attached through an oxy (—O—) moiety (e.g., methoxy, ethoxy, propoxy, butoxy, 1,2-isopropoxy, cyclopentyloxy, cyclohexyloxy and the like). These alkoxy moieties may be substituted or unsubstituted.

"Alkyl carbonyl" refers to an alkyl group as defined above which is attached through a carbonyl group (—C(=O)—)) moiety (e.g., methylcarbonyl, ethylcarbonyl, propylcarbonyl, buttylcarbonyl, cyclopentylcarbonyl and the like). These alkyl carbonyl moieties may be substituted or unsubstituted.

"Halo" or "halide" refers to a halogen (e.g., F, Cl, Br and I).

"Hydroxy" (a.k.a. "hydroxyl") refers to an —OH group.

Unless otherwise indicated, the term "substituted" when referring to an alkyl, alkoxy, fluorinated alkyl and the like refers to one of these moieties which also contains one or more substituents including, but not limited, to the following substituents: alkyl, substituted alkyl, unsubstituted aryl, substituted aryl, alkyloxy, alkylaryl, haloalkyl, halide, hydroxy, amino and amino alkyl. Similarly, the term "unsubstituted" refers to these same moieties where no substituents apart from hydrogen are present.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that any of the incorporated literature and similar materials defines a term in a manner that contradicts the definition of that term in this application, this application controls.

DETAILED DESCRIPTION

It is to be understood that both the foregoing general description and the following detailed description are illustrative and explanatory, and are not restrictive of the subject matter, as claimed. The objects, features, advantages and ideas of the disclosed subject matter will be apparent to those skilled in the art from the description provided in the specification, and the disclosed subject matter will be readily practicable by those skilled in the art on the basis of the description appearing herein. The description of any "preferred embodiments" and/or the examples which show preferred modes for practicing the disclosed subject matter are included for the purpose of explanation and are not intended to limit the scope of the claims.

It will also be apparent to those skilled in the art that various modifications may be made in how the disclosed subject matter is practiced based on described aspects in the specification without departing from the spirit and scope of the disclosed subject matter disclosed herein.

Figure 2:
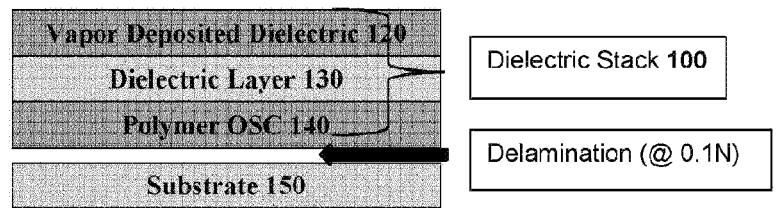
FIG. 2 illustrates the region of delamination between polymer OSC 140 and substrate 150 in a traditionally prepared dielectric stack.

As set forth above, the disclosed subject matter relates to a dielectric stack having reduced stress that includes a vapor deposited dielectric that overlays an organic dielectric which in turn overlays a polymeric OSC material that are collectively to be disposed on a substrate. It has been observed that a dielectric stack having the structure shown in FIG. 1 is subject to failure due to adhesion loss (i.e., delamination) where, for example, the vapor deposited dielectric 110 in the dielectric stack is a poly(p-xylylene) polymer (such as those sold under the trade name Parylene™). In particular, as is shown in FIG. 2, it was observed that under traditional process conditions a dielectric stack 100 delaminates from the substrate 150 at 0.1 N of applied force. As can be seen in FIG. 2, the region of delamination is between polymer OSC 140 and substrate 150. Consequently, there is a complete failure (i.e., delamination) of all of the layers making up the dielectric stack 100 from substrate 150.

Figure 3:
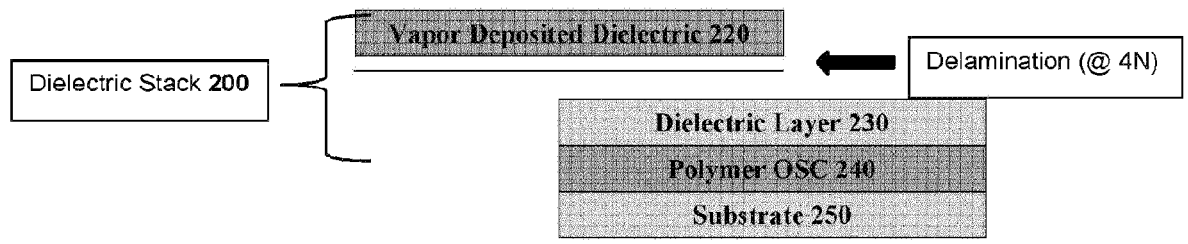
FIG. 3 illustrates the region of delamination between vapor deposited dielectric 220 and dielectric layer 230 in a dielectric stack prepared by the method of the disclosed subject matter.

In contrast, a dielectric stack manufactured by the method of the disclosed subject matter results in a dielectric stack that exhibits a significantly stronger bond to the substrate. As shown in FIG. 3, a dielectric stack 200 manufactured as disclosed herein requires significantly more force (i.e., 4 N) to induce delamination. Moreover, the region of delamination is between vapor deposited dielectric 220 (e.g., a poly(p-xylylene) polymer) and the dielectric layer 230, not between dielectric stack 200 and substrate 250 Thus, the resulting bond between polymer OSC 240 and substrate 250 is at least forty (40) times stronger than that present in a traditionally manufactured dielectric such as that illustrated in FIG. 2 where delamination occurred between polymer OSC 140 and substrate 150 at only 0.1 N of force.

The adhesion loss illustrated in FIG. 2 can be resolved by preparing and employing a dielectric layer formed from an appropriately designed dielectric material. In particular, the constituent components of the dielectric material are selected such that each has a Tg value of 70° C. or lower. The dielectric material so constituted is then applied in sufficient quantity to the polymer OSC 240 layer and subjected—prior to deposition of the vapor deposited dielectric 220 layer—to an annealing process at a temperature greater than the Tg of the constituent components so as to form a dielectric layer 230. In the process, the dielectric material is applied in sufficient quantity that after annealing the dielectric layer 230 has a thickness of 200 nm or greater. Thus, for example, if the dielectric is composed of two constituents having Tg values of 52° C. and 70° C., respectively, it would be preconditioned at a temperature greater than 70° C. prior to deposition of the vapor deposited dielectric 220. In one embodiment, for example, the dielectric material is a blend (e.g., 1:1 by weight) of poly(vinyltoluene-co-alpha-methylstyrene) (PVT-MS) and a cyclic olefin polymer (e.g., Topas-8007® dissolved in a solvent such as 1,4-diisopropylbenzene.

Figure 4:
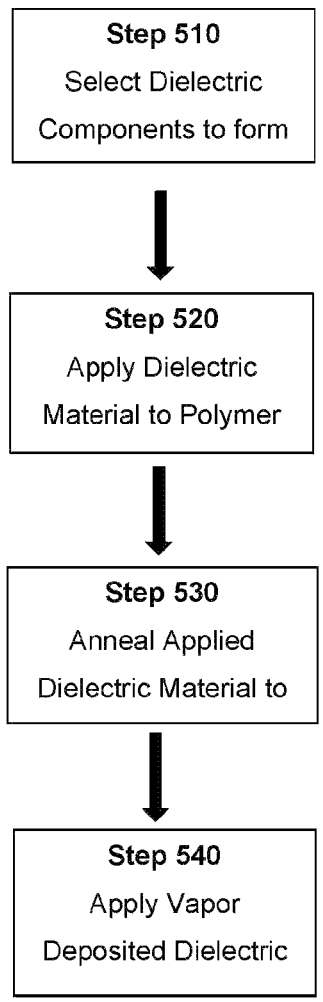
FIG. 4 illustrates a process 500 by which a dielectric layer of the disclosed subject matter can be prepared and used.

FIG. 4 illustrate a process 500 for preparing a dielectric stack that utilizes a dielectric material of the disclosed subject matter. In step 510 a dielectric material is prepared by selecting one or more constituent components each having a Tg value of 70° C. or lower. The selected one or more constituent components is mixed as appropriate, desired and/or necessary. In step 520, the one or more constituent components of the dielectric material selected in step 510 are applied to a polymer OSC layer. The selected one or more constituent components can be mixed as appropriate and/or necessary as part of or prior to application to the polymer OSC layer. In step 530, the one or more constituent components of dielectric material applied to the polymer OSC layer in step 520 are annealed at a temperature exceeding the Tg value of the one or more constituent components to form a dielectric layer on the polymer OSC layer. The dielectric material applied in step 520 is applied in sufficient quantity that after annealing in step 530 the dielectric layer formed has a thickness of 200 nm or greater. Finally, in step 540, a vapor deposited dielectric is applied to the dielectric layer formed in step 530.

In one embodiment, the vapor deposited dielectric is a poly(p-xylylene) polymer such as those sold under the trade name Parylene™. Poly(p-xylylene), which herein may also be referred to as Parylene™, is generally prepared by chemical vapor deposition of a p-xylylene intermediate of the following formula (V-a):

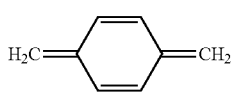

(V-a)

which may optionally be substituted as described below. Such p-xylyene intermediates can be derived from [2.2] paracyclophane of the following formula (V-b):

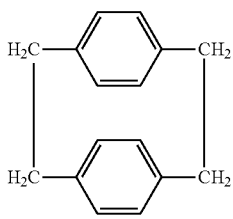

(V-b)

The phenylene rings and/or the methylene groups of the p-xylylene repeating units in the polymers may also be substituted. The polymers may also include two or more distinct types of unsubstituted and/or substituted p-xylylene repeating units. For example, Parylene N denotes unsubstituted poly(p-xylylene) of the following formula (V-c):

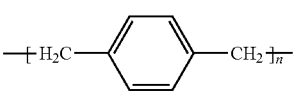

(V-c)

while Parylene C and Parlyene D denote mono- or dichlorinated poly(p-xylylene) of the following formulae (V-d) and (V-e), respectively

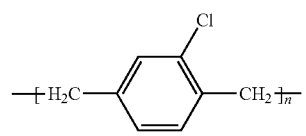

(V-d)

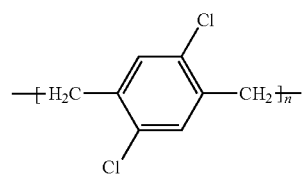

(V-e)

Further examples of suitable poly(p-xylylenes) include for example those wherein the phenylene or methylene groups are fluorinated, like Parylene AF-4, Parylene SF, or Parylene HT all including difluorinated methylene groups, or Parylene VT including a fluorinated phenylene. Further Parylene types include polymers where the phenylene ring is substituted by a reactive or crosslinkable group, for example by an amine (Parylene A), a methylamine (Parylene AM), or an ethynyl group (Parylene X).

Unless stated otherwise, the terms "Parylene" and "poly (p-xylylene)" as used herein, are understood to include both unsubstituted and substituted Parylene types, including but not limited to Parylene N, C, D, AF-4, SF, HT, VT, A, AM, X, etc.

The disclosed subject matter also relates to a dielectric material (as well as a dielectric stack containing the same, methods for manufacturing the same and/or methods for using the same) in which the dielectric material includes one or more constituent components each independently have a Tg value somewhat above 70° C. (i.e., where the Tg value is "approximately" or "about" 70° C. or lower). For example, in some embodiments the dielectric material can include one or more constituent components each having Tg values exceeding 70° C. by up to 10%. Thus, in such embodiments the dielectric material includes one or more constituent components with a Tg value of up to 77° C. In other embodiments the dielectric material can include one or more constituent components each having Tg values exceeding 70° C. by up to 5%. Thus, in such embodiments the dielectric material includes one or more constituent components with a Tg value of up to 73.5° C.

The disclosed subject matter also relates to a dielectric layer formed from the dielectric material having a thickness somewhat less than 200 nm (i.e., where the layer thickness is "approximately" or "about" 200 nm or greater). In some embodiments, for example, the dielectric layer can have a thickness that is partially or entirely less than 200 nm thick by up to 10%. Thus, such embodiments can have a dielectric layer that is entirely or includes portions that are as thin as 180 nm. In other embodiments, for example, the dielectric layer can have a thickness that is partially or entirely less than 200 nm thick by up to 5%. Thus, such embodiments can have a dielectric layer that is entirely or includes portions that are as thin as 190 nm.

In further embodiments, the dielectric material consists essentially of one or more constituent components each having a Tg value of 70° C. or lower. Such a dielectric material can include other ingredients (e.g., additional solvent(s), including water, common additives and/or impurities) that do not materially change the effectiveness of the dielectric layer formed therefrom and/or the resulting dielectric stack utilizing the same.

In further embodiments, the dielectric material consists of one or more constituent components each having a Tg value of 70° C. or lower. Such a dielectric material can include other small and/or trace amounts of impurities that are present in such small quantities that they do not materially change the effectiveness of the dielectric layer formed therefrom and/or the resulting dielectric stack utilizing the same. For example, in one such embodiment, the dielectric material can contain 2% by weight or less of total impurities and/or other ingredients. In another embodiment, the rinse can contain 1% by weight or less than of total impurities and/or other ingredients. In a further embodiment, the rinse can contain 0.05% by weight or less than of total impurities and/or other ingredients.

Although the invention has been described and illustrated with a certain degree of particularity, it is understood that the disclosure has been made only by way of example, and that numerous changes in the conditions and order of steps can be resorted to by those skilled in the art without departing from the spirit and scope of the invention.

The invention claimed is:

1. A dielectric stack comprising a dielectric layer, said dielectric layer comprising a dielectric material, said dielectric material comprising one or more constituent components each having a glass transition temperature (Tg) value of 70° C. or lower,
and wherein:
   a vapor deposited dielectric is disposed on the dielectric layer; and
   the dielectric material includes:
      poly(vinyltoluene-co-alpha-methylstyrene); and/or
      a cyclic olefin polymer.

2. The dielectric stack according to claim 1, the dielectric material consisting essentially of one or more constituent components each having the Tg value of 70° C. or lower.

3. The dielectric stack of claim 1, wherein the dielectric material includes poly(vinyltoluene-co-alpha-methylstyrene).

4. The dielectric stack of claim 1, wherein the dielectric material includes a cyclic olefin polymer.

5. The dielectric stack of claim 1, wherein the dielectric material includes a blend of poly(vinyltoluene-co-alpha-methylstyrene) and a cyclic olefin polymer.

6. The dielectric stack of claim 1, wherein the one or more constituent components is annealed at a temperature greater than the Tg of the one or more constituent components.

7. The dielectric stack of claim 6, wherein the dielectric layer has a thickness of approximately 200 nm or greater.

8. The dielectric stack of claim 1, wherein the vapor deposited dielectric is a poly(p-xylylene) polymer.

9. A process for preparing a dielectric stack, the process comprising the steps of:
   (i) preparing a dielectric material comprising one or more constituent components each having a Tg value of 70° C. or lower;
   (ii) applying the dielectric material to a polymeric organic semiconductor layer;
   (iii) forming a dielectric layer on the polymeric organic semiconductor by annealing the dielectric material at a temperature exceeding the Tg value of the constituent components;
   and (iv) applying a vapor deposited dielectric to the dielectric layer,
   wherein the dielectric material is applied to the polymeric organic semiconductor layer in sufficient quantity such that the dielectric layer has a thickness of 200 nm or greater after annealing; and
   the dielectric material includes poly (vinyltoluene-co-alpha-methylstyrene) and/or a cyclic olefin polymer.

10. The process of claim 9, wherein the dielectric material consists essentially of one or more constituent components each having a Tg value of 70° C. or lower.

11. The process of claim 9, wherein the vapor deposited dielectric is a poly(p-xylylene) polymer.

12. The process of claim 9, wherein the dielectric material includes poly(vinyltoluene-co-alpha-methylstyrene).

13. The process of claim 9, wherein the dielectric material includes a cyclic olefin polymer.

14. The process of claim 9, wherein the dielectric material includes a blend of poly(vinyltoluene-co-alpha-methylstyrene) and a cyclic olefin polymer.

* * * * *